United States Patent
Zhang et al.

(10) Patent No.: US 12,009,635 B2
(45) Date of Patent: Jun. 11, 2024

(54) SWITCHING CIRCUIT FOR BURST-MODE TUNABLE LASER

(71) Applicant: Google LLC, Mountain View, CA (US)

(72) Inventors: Tao Zhang, Mountain View, CA (US); Cedric Fung Lam, San Carlos, CA (US); Xiangjun Zhao, Fremont, CA (US); Shuang Yin, Sunnyvale, CA (US); Liang Du, Santa Clara, CA (US); Changhong Joy Jiang, Dublin, CA (US); Adam Edwin Taylor Ward Barratt, Portland, OR (US); Claudio Desanti, Mountain View, CA (US); Muthu Nagarajan, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 820 days.

(21) Appl. No.: 17/057,649

(22) PCT Filed: May 7, 2019

(86) PCT No.: PCT/US2019/031142
§ 371 (c)(1),
(2) Date: Nov. 21, 2020

(87) PCT Pub. No.: WO2019/226338
PCT Pub. Date: Nov. 28, 2019

(65) Prior Publication Data
US 2021/0167577 A1    Jun. 3, 2021

Related U.S. Application Data

(60) Provisional application No. 62/674,311, filed on May 21, 2018.

(51) Int. Cl.
*H01S 5/0625* (2006.01)
*H01S 5/024* (2006.01)
(Continued)

(52) U.S. Cl.
CPC ...... *H01S 5/06256* (2013.01); *H01S 5/02415* (2013.01); *H04B 10/504* (2013.01); *H04B 10/572* (2013.01); *H04J 14/0282* (2013.01)

(58) Field of Classification Search
CPC ............. H01S 5/06256; H01S 5/02415; H01S 5/0428; H04B 10/504; H04B 10/572; H04J 14/0282
See application file for complete search history.

(56) References Cited

U.S. PATENT DOCUMENTS 5,088,097 A * 2/1992 Ono ...................... H01S 3/1055
372/20
7,720,116 B2    5/2010 Anderson et al.
(Continued)

FOREIGN PATENT DOCUMENTS

| CN | 106330328 A | * | 1/2017 |
| CN | 106330328 A | | 1/2017 |
| TW | 201433041 A | | 8/2014 |

OTHER PUBLICATIONS

Office Action, Taiwan Patent Application No. 108117277, dated May 14, 2021, 9 pages.

*Primary Examiner* — Xinning(Tom) Niu
(74) *Attorney, Agent, or Firm* — Honigman LLP; Brett A. Krueger

(57) ABSTRACT

A method (600) for tuning a tunable laser (310) includes delivering a bias current ($I_{DBR}$) to an anode of a distributed Bragg reflector (DBR) section diode ($D_2$) disposed on a shared substrate of the tunable laser and receiving a burst mode signal (440) indicative of a burst-on state or a burst-off state. When the burst mode signal is indicative of the burst-off state, the method includes offsetting the bias current at the anode of the DBR section diode by one of sourcing a push current with the bias current to the anode of the DBR section diode or sinking a pull current away from (Continued)

the bias current at the anode of the DBR section diode. When the burst mode signal is indicative of the burst-on state, the method also includes ceasing any offsetting of the bias current at the anode of the DBR section diode.

26 Claims, 9 Drawing Sheets

(51) Int. Cl.
*H04B 10/50* (2013.01)
*H04B 10/572* (2013.01)
*H04J 14/02* (2006.01)

(56) References Cited

U.S. PATENT DOCUMENTS

| | | | |
|---|---|---|---|
| 2002/0075919 A1* | 6/2002 | Tochio | H01S 5/042 |
| | | | 372/38.02 |
| 2008/0025358 A1* | 1/2008 | Arahira | H01S 5/06256 |
| | | | 372/38.02 |
| 2016/0013614 A1* | 1/2016 | Moto | H01S 5/0427 |
| | | | 372/38.02 |
| 2016/0142151 A1 | 5/2016 | Wang et al. | |

* cited by examiner

SWITCHING CIRCUIT FOR BURST-MODE TUNABLE LASER

TECHNICAL FIELD

This disclosure relates to a switching circuit for a burst-mode tunable laser.

BACKGROUND

Fiber optic communication is an emerging method of transmitting information from a source (transmitter) to a destination (receiver) using optical fibers as the communication channel. A Wavelength-Division Multiplexing Passive Optical Network (WDM-PON) is an optical technology for access and backhaul networks. WDM-PON uses multiple different wavelengths over a physical point-to-multipoint fiber infrastructure that contains passive optical components. The use of different wavelengths allows for traffic separation within the same physical fiber. The result is a network that provides logical point-to-point connections over a physical point-to-multipoint network topology. WDM-PON allows operators to deliver high bandwidth to multiple endpoints over long distances. A Passive Optical Network (PON) generally includes an optical line terminal located at a service provider central office (e.g., a hub), a remote node connected to the central office by a feeder fiber, and a number of optical network, units or optical network terminals, near end users. The remote node demultiplexes an optical signal from the central office and distributes the demultiplexed optical signals to multiple optical network terminals along corresponding distribution fibers. Time-division-multiplexing (TDM) is a method of transmitting and receiving independent signals over a common signal path by using different, non-overlapping time slots. Time wavelength division multiplexing (TWDM) uses both time and wavelength dimensions to multiplex signals. Color-less optical network units (ONUs), which are based on tunable laser and suitable driving topologies, are critical components for flexible WDM/TWDM-PON system architectures. The laser driving circuit in the ONU is the component to generate the upstream optical signal. To meet the WDM/TWDM-PON system requirements, the driving circuit has to guarantee the optical output has not only enough power and modulation magnitudes, but also short burst switching times and minimum wavelength drifts.

SUMMARY

One aspect of the disclosure provides a method for tuning a tunable laser. The method includes delivering, by a switching circuit, a bias current to an anode of a distributed Bragg reflector (DBR) section diode disposed on a shared substrate of the tunable laser, and receiving, at the switching circuit, a burst mode signal indicative of a burst-on state or a burst-off state. When the burst mode signal is indicative of the burst-off state, the method also includes offsetting, by the switching circuit, the bias current at the anode of the DBR section diode by one of: sourcing a push current with the bias current to the anode of the DBR section diode, or sinking a pull current away from the bias current at the anode of the DBR section diode. When the burst mode signal is indicative of the burst-on state, the method also includes ceasing, by the switching circuit, any offsetting of the bias current at the anode of the DBR section diode.

Implementations of the disclosure may include one or more of the following optional features. In some implementations, the bias current at the anode of the DBR section diode causes the tunable laser to transmit on a first channel associated with a working wavelength when the burst mode signal is indicative of the burst-on state, while the offsetting of the bias current at the anode of the DBR section diode causes the tunable laser to transmit on a second channel adjacent to the first channel when the burst mode signal is indicative of the burst-off state, the second channel associated with a standby wavelength. In these implementations, the standby wavelength may be greater than the working wavelength when the bias current at the anode of the DBR section diode is offset by sourcing the push current with the bias current. On the other hand, the standby wavelength may be less than the working wavelength when the bias current at the anode of the DBR section diode is offset by sinking the pull current away from the bias current.

In some examples, when the burst mode signal is indicative of the burst-off state, the DBR section diode receives a diode current equal to a sum of the bias current and a difference between a source current that sources current to the anode of the DBR section diode and a sink current that sinks current away from the bias current at the anode of the DBR section diode. In these examples, when the burst mode signal is indicative of the burst-off state and the source current is greater than the sink current, the bias current may be offset by the sourcing of the push current with a magnitude equal to the difference between the source current and the sink current. In additional examples, when the burst mode signal is indicative of the burst-off state and the source current is less than the sink current, the bias current is offset by the sinking of the pull current from the bias current by a magnitude equal to the difference between the source current and the sink current. Additionally or alternatively, when the burst mode signal is indicative of the burst-on state, the DBR section diode may receive a diode current equal to the bias current.

In some implementations, when the burst mode signal is indicative of the burst-off state, the method also includes: receiving, at the switching circuit, a sink current from a current pull stage of the switching circuit that sinks current away from the bias current at the anode of the DBR section diode; and receiving, at the switching circuit, a source current from a current push stage of the switching circuit that sources current to the anode of the DBR section diode. In these implementations, the current pull stage may include a differential pair of first and second transistors, each transistor connected to a burst mode signal source, the first transistor connected to a first inductor and a resistor, the resistor connected to a voltage source, the second transistor connected to a second inductor, the second inductor connected to the anode of the DBR section diode. The first transistor may be turned off and the second transistor may be turned on to sink the sink current away from the anode of the DBR section diode when the burst mode signal is indicative of the burst-off state. On the other hand, the first transistor may be turned on and the second transistor may be turned off to sink current across the resistor, the first inductor, and the first transistor from the voltage source connected to the resistor when the burst mode signal is indicative of the burst-on state.

In additional implementations, the current push stage includes a differential pair of first and second transistors, each transistor connected to a burst mode signal source and a voltage source, the first transistor connected to a first inductor and a resistor, the resistor connected to ground, the second transistor connected to a second inductor, the second inductor connected to the anode of the DBR section diode.

The first transistor may be turned off and the second transistor may be turned on to source the source current to the anode of the DBR section diode when the burst mode signal is indicative of the burst-off state. Conversely, the first transistor may be turned on and the second transistor may be turned off to draw the source current across the first transistor and through the first inductor and the resistor to the ground.

Another aspect of the disclosure provides a laser driving circuit that includes a voltage source configured to deliver a bias current to an anode of the DBR section diode and a current controller configured to receive a burst mode signal indicative of a burst-on state or a burst-off state. When the burst mode signal is indicative of the burst-off state, the current controller is configured to offset the bias current at the anode of the DBR section diode by one of: sourcing a push current with the bias current to the anode of the DBR section diode; or sinking a pull current away from the bias current at the anode of the DBR section diode. When the burst mode signal is indicative of the burst-on state, the current controller is configured to cease any offsetting of the bias current at the anode of the DBR section diode.

This aspect may include one or more of the following optional features. In some implementations, the bias current at the anode of the DBR section diode causes the tunable laser to transmit on a first channel associated with a working wavelength when the burst mode signal is indicative of the burst-on state, while the offsetting of the bias current at the anode of the DBR section diode causes the tunable laser to transmit on a second channel adjacent to the first channel when the burst mode signal is indicative of the burst-off state, the second channel associated with a standby wavelength. In these implementations, the standby wavelength may be greater than the working wavelength when the bias current at the anode of the DBR section diode is offset by sourcing the push current with the bias current. On the other hand, the standby wavelength may be less than the working wavelength when the bias current at the anode of the DBR section diode is offset by sinking the pull current away from the bias current.

In some examples, when the burst mode signal is indicative of the burst-off state, the DBR section diode receives a diode current, equal to a sum of the bias current and a difference between a source current that sources current to the anode of the DBR section diode and a sink current that sinks current away from the bias current at the anode of the DBR section diode. In these examples, when the burst mode signal is indicative of the burst-off state and the source current is greater than the sink current the bias current may be offset by the sourcing of the push current with a magnitude equal to the difference between the source current and the sink current. In additional examples, when the burst mode signal is indicative of the burst-off state and the source current is less than the sink current, the bias current is offset by the sinking of the pull current from the bias current by a magnitude equal to the difference between the source current and the sink current. Additionally or alternatively, when the burst mode signal is indicative of the burst-on state, the DBR section diode may receive a diode current equal to the bias current.

In some implementations, the switching circuit also includes a current pull stage configured to sink a sink current away from the bias current at the anode of the DBR section diode when the burst mode signal is indicative of the burst-off state, and a current push stage configured to source a source current to the anode of the DBR section diode when the burst mode signal is indicative of the burst-off state. In these implementations, the current pull stage may include a differential pair of first and second transistors, each transistor connected to a burst mode signal source, the first transistor connected to a first inductor and a resistor, the resistor connected to a voltage source, the second transistor connected to a second inductor, the second inductor connected to the anode of the DBR section diode. The first transistor may be turned off and the second transistor may be turned on to sink the sink current away from the anode of the DBR section diode when the burst mode signal is indicative of the burst-off state. On the other hand, the first transistor may be turned on and the second transistor may be turned off to sink current across the resistor, the first inductor, and the first transistor from the voltage source connected to the resistor when the burst mode signal is indicative of the burst-on state.

In additional implementations, the current push stage includes a differential pair of first and second transistors, each transistor connected to a burst mode signal source and a voltage source, the first transistor connected to a first inductor and a resistor, the resistor connected to ground, the second transistor connected to a second inductor, the second inductor connected to the anode of the DBR section diode. The first transistor may be turned off and the second transistor may be turned on to source the source current to the anode of the DBR section diode when the burst mode signal is indicative of the burst-off state. Conversely, the first transistor may be turned on and the second transistor may be turned off to draw the source current across the first transistor and through the first inductor and the resistor to the ground.

The details of one or more implementations of the disclosure are set forth in the accompanying drawings and the description below. Other aspects, features, and advantages will be apparent from the description and drawings, and from the claims.

DESCRIPTION OF DRAWINGS

Like reference symbols in the various drawings indicate like elements.

DETAILED DESCRIPTION

Figure 1:
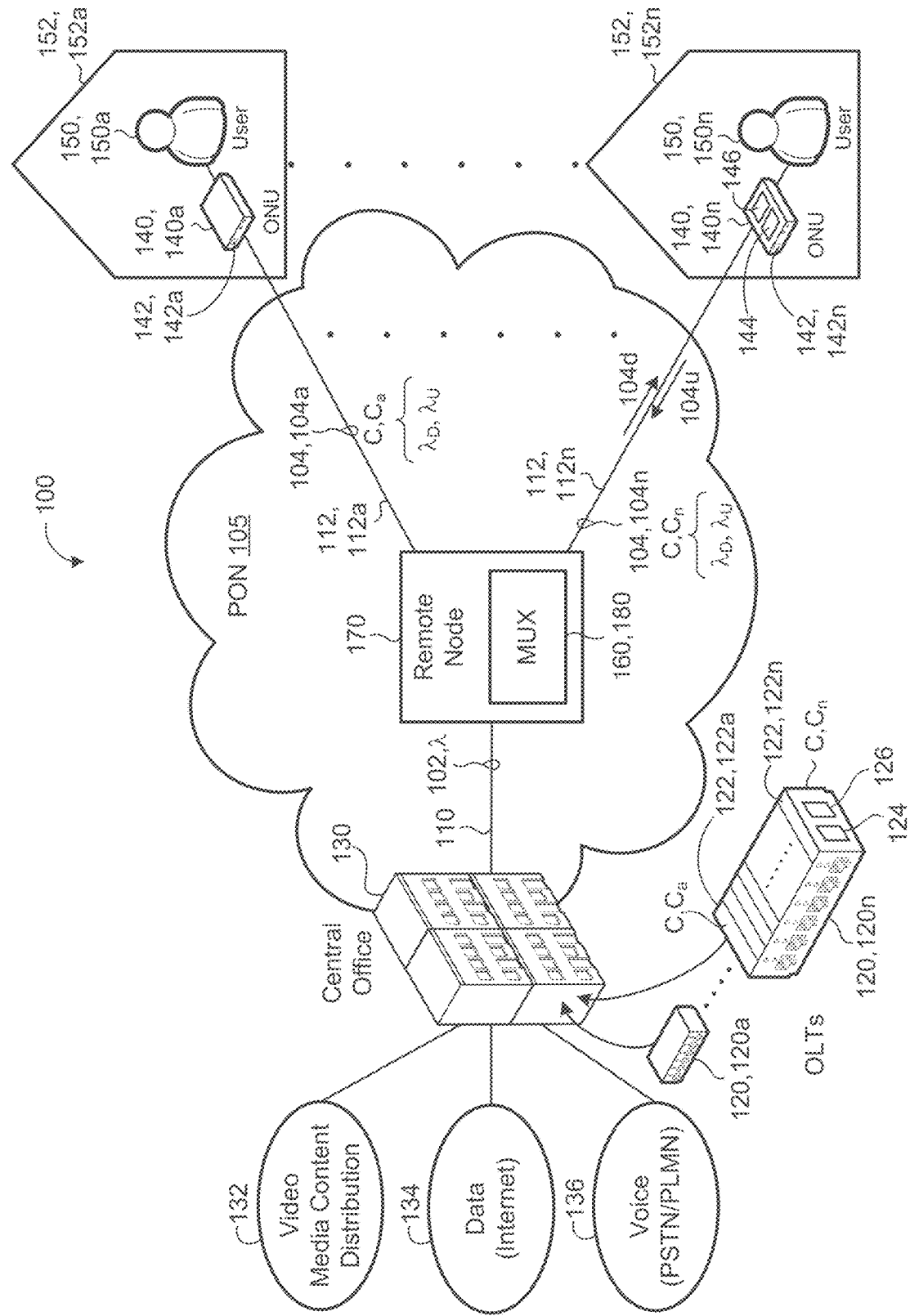
FIG. 1 is a schematic view of an example communication system.

Referring to FIG. 1, an optical communication system 100 delivers communication signals 102 (e.g., optical signals)

through communication links 110, 112, 112a-n (e.g., optical fibers or line-of-sight free space optical communications) between an optical line terminal (OLT) 120 housed in a central office (CO) 130 and optical network units (ONUs) 140, 140a-n (e.g., a bidirectional optical transceiver) associated with users 150, 150a-n (also referred to as customers or subscribers) The ONUs 140, 140a-n are typically located at premises 152, 152a-n of the users 150, 150a-n.

Customer premises equipment (CPE) is any terminal and associated equipment located at the premises 152 of the user 150 and connected to a carrier telecommunication channel C at a demarcation point ("demarc"). In the examples shown, the ONU 140 is a CPE. The demarc is a point established in a house, building, or complex to separate customer equipment from service provider equipment CPE generally refers to devices such as telephones, routers, switches, residential gateways (RG), set-top boxes, fixed mobile convergence products, home networking adapters, or Internet access gateways that enable the user 150 to access services of a communications service provider and distribute them around the premises 152 of the user 150 via a local area network (LAN).

In some implementations, the optical communication system 100 implements an optical access network 105, such as a passive optical network (PON) 105, for example, for access and mobile fronthaul/backhaul networks. In some examples, the optical communication system 100 implements a point-to-point (pt-2-pt) PON having direct connections, such as optical Ethernets, where a home-run optical link 110, 112 (e.g., fiber) extends all the way back to an OLT 120 at the CO 130 and each customer 150, 150a-n is terminated by a separate OLT 120a-n. In other examples, the optical communication system 100 implements a point-to-multi-point (pt-2-multi-pt) PON where a shared OLT 120 services multiple customers 150, 150a-n.

The CO 130 includes at least one OLT 120 connecting the optical access network 105 to an Internet Protocol (IP), Asynchronous Transfer Mode (ATM), or Synchronous Optical Networking (SONET) backbone, for example. Therefore, each OLT 120 is an endpoint of the PON 105 and converts between electrical signals used by service provider equipment and optical signals 102 used by the PON 105. Each OLT 120, 120a-n includes at least one transceiver 122, 122a-n, depending on the implementation of the optical access network 105. The OLT 120 sends the optical signal 102 via a corresponding transceiver 122, through a feeder fiber 110 to a remote node (RN) 170, which includes a band-multiplexer 160 configured to demultiplex the optical signal 102 and distribute demulitplexed optical signals 104 to multiple users 150, 150a-n along corresponding distribution fibers 112, 112a-n. The band-multiplexer 160 for multiplexing/demultiplexing may be an arrayed waveguide grating 180 (AWG), which is a passive optical device. In some examples, each CO 130 includes multiple OLTs 120, 120a-n, and each OLT 120 is configured to service a group of users 150. In addition, each OLT 120 may be configured to provide signals in different services, e.g., one OLT 120 may provide services in 1G-PON, while another OLT 120 provides services in 10G-PON.

As shown in FIG. 1, the CO 130 multiplexes signals received from several sources, such as a video media distribution source 132, an Internet data source 134, and a voice data source 136, and multiplexes the received signals into one multiplexed signal 102 before sending the multiplexed optical signal 102 to the RN 170 through the feeder fiber 110. The multiplexing may be performed by the OLT 120 or a broadband network gateway (BNG) positioned at the CO 130. Typically, services are time-division-multiplexed on the packet layer.

Time-division-multiplexing (TDM) is a method of transmitting and receiving independent signals over a common signal path by using different, non-overlapping time slots. Wavelength division multiplexing (WDM) uses multiple wavelengths λ to implement point-to-multi-point communications in the PON 105. The OLT 120 serves multiple wavelengths through one fiber 110 to the band-multiplexer 160 at the RN 170, which multiplexes/demultiplexes signals between the OLT 120 and a plurality of ONUs 140, 140a-n. Multiplexing combines several input signals and outputs a combined signal. Time wavelength division multiplexing (TWDM) uses both time and wavelength dimensions to multiplex signals.

For WDM and dense-WDM (DWDM), the OLT 120 includes multiple optical transceivers 122, 122a-n. Each optical transceiver 122 transmits signals at one fixed wavelength $\lambda_D$ (referred to as a downstream wavelength) and receives optical signals 102 at one fixed wavelength $\lambda_U$ (referral to as an upstream wavelength). The downstream and upstream wavelengths $\lambda_D$, $\lambda_U$ may be the same or different. Moreover, a channel C may define a pair of downstream and upstream wavelengths $\lambda_D$, $\lambda_U$, and each optical transceiver 122, 122-n of a corresponding OLT 120 may be assigned a unique channel $C_{a-n}$.

The OLT 120 multiplexes/demultiplexes the channels C, $C_{a-n}$ of its optical transceivers 122, 122a-n for communication of an optical signal 102 through the feeder fiber 110. Whereas, the band-multiplexer 160 at the RN 170 multiplexes/demultiplexes optical signals 102, 104, 104-n between the OLT 120 and a plurality of ONUs 140, 140a-n. For example, for downstream communications, the band-multiplexer 160 demultiplexes the optical signal 102 from the OLT 120 into ONU optical signals 104, 101a-n, i.e., downstream optical signals 104d, for each corresponding ONU 140, 140a-n. For upstream communications, the band-multiplexer 160 multiplexes ONU optical signals 104, 104a-n from each corresponding ONU 140, 140a-n, i.e., upstream optical signals 104u, into the optical signal 102 for delivery to the OLT 120. To make the transmission successful, the optical transceivers 122, 122a-n of the OLT 120 match with the ONUs 140, 140a-n one-by-one. In other words, the downstream and upstream wavelengths $\lambda_D$, $\lambda_U$ (i.e., the channel C) of respective downstream and upstream optical signals 104d, 104u to and from a given ONU 140 matches the downstream and upstream wavelengths $\lambda_D$, $\lambda_U$ (i.e., the channel C) of a corresponding optical transceiver 122.

In some implementations, each ONU 140, 140a-n includes a corresponding tunable ONU transceiver 142, 142a-n (e.g., that includes a laser or light emitting diode) that can tune to any wavelength λ used by a corresponding OUT 120 at a receiving end. The ONU 140 may automatically tune the tunable ONU transceiver 142 to a wavelength λ that establishes a communication link between the corresponding OLT 120 and the ONU 140. Each optical transceiver 122, 142 may include data processing hardware 124, 144 (e.g., control hardware, circuitry, field programmable gate arrays (FPGAs, etc.) and memory hardware 126, 146 in communication with the data processing hardware 124, 144. The memory hardware 126, 146 may store instructions (e.g., via firmware) that when executed on the data processing hardware 124, 144 cause the data processing hardware 124, 144 to perform operations for auto-tuning the optical transceiver 122, 142. In some configurations, the tunable ONU transceiver 142 includes a laser driving circuit 400 (FIG. 4 and also referred to as a biasing circuit) configured to continuously provide a current to a tunable laser 300 (FIGS. 3A-3B) in a burst-on state and a burst-off state. The ONU 140 may include a photodetector that converts the optical wave to an electrical form. The electrical signal may be further de-multiplexed down to subcomponents (e.g., data over a network, sound waves converted into currents using microphones and back to its original physical form using speakers, converting images converted into currents using video cameras and converting back to its physical form using a television).

Figure 2:
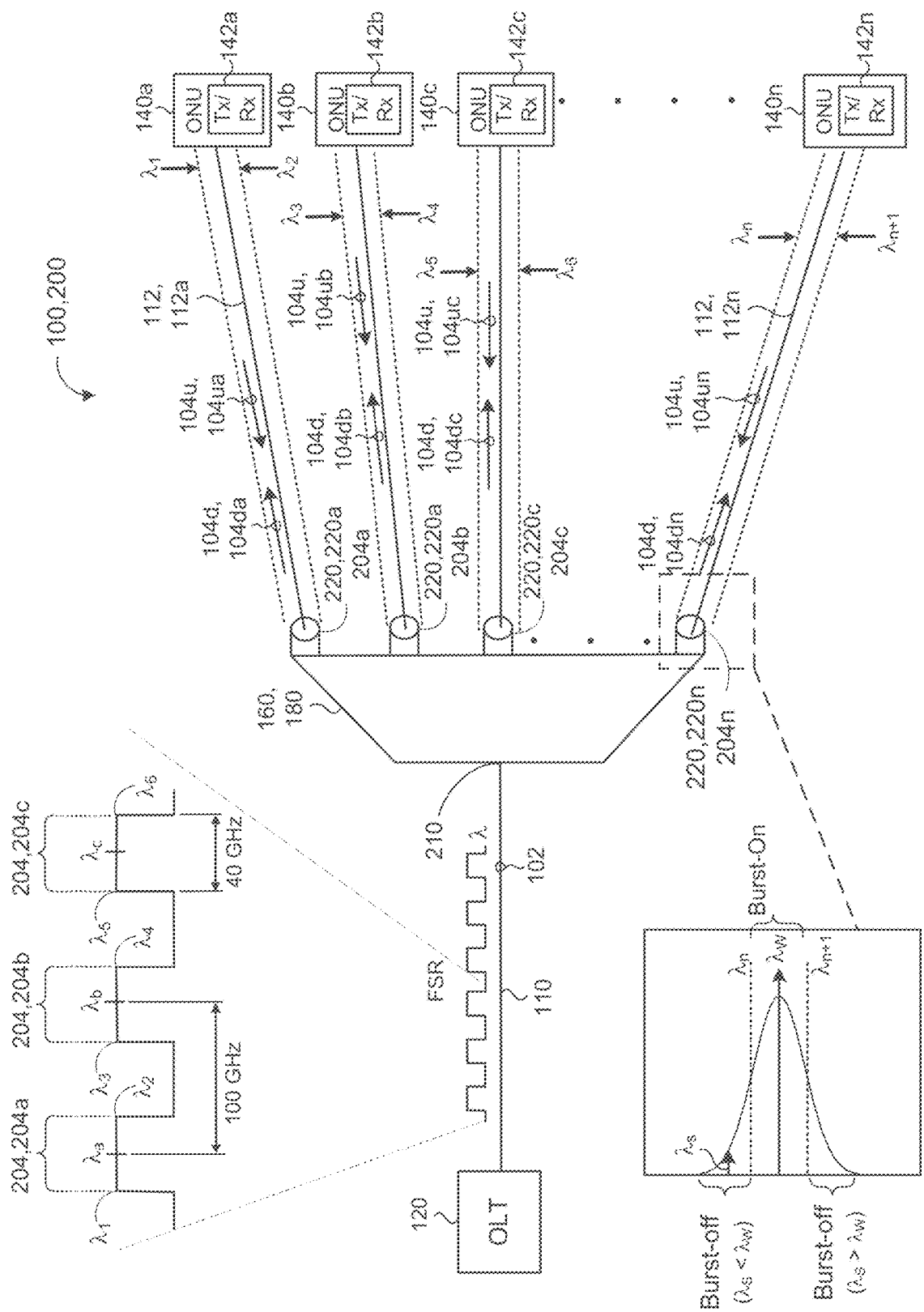
FIG. 2 is a schematic view of an example dense-wavelength division multiplexing architecture for a communication system.

FIG. 2 illustrates an example DWDM architecture 200 for the communication system 100 that facilitates user aggregation onto a single strand of fiber 110, 112, 112a-n. In some examples, an arrayed waveguide grating 180 (AWG), which may be used as a band-multiplexer 160, is optically coupled to the OLT 120 and a plurality of ONUs 140, 140a-n. The AWG 180 may be used to demultiplex an optical signal 102 through the feeder fiber 110 from the OLT 120 into downstream ONU optical signals 104d, 104da-104dn of several different wavelengths $\lambda$ for each corresponding ONU 140, 140a-n. The AWG 180 may reciprocally multiplex upstream ONU optical signals 104u, 104ua-104un of different wavelengths $\lambda$ from each ONU 140 into a single optical feeder fiber 110, whereby the OLT 120 receives the multiplexed optical signal 104 through the feeder fiber 110. The AWG 180 includes a multiplex port 210 optically coupled to the OLT 120 and a plurality of demultiplex ports 220, 220a-n. Each demultiplex port 220 is optically coupled to a corresponding ONU 140 of the plurality of ONUs 140, 140a-n. In some examples, the AWG 180 is disposed at the RN 170. In other examples, the AWG 180 is disposed at the OLT 120, or more specifically, co-located with the OLT 120 at the CO 130.

The AWG 180 is cyclic in nature. The wavelength multiplexing and demultiplexing property of the AWG 180 repeats over periods of wavelengths called free spectral range (FSR). Multiple wavelengths, separated by the FSR, are passed through the AWG 180 from each demultiplex port 220 to the multiplex port 210. In the example shown, each of the multiple wavelengths $\lambda$ of the FSR are separated by about 100 Gigahertz (GHz) with a wavelength pass-band 204 of about 40 GHz. For instance, first, second, and third wavelengths $\lambda_a$, $\lambda_b$, $\lambda_c$ are each separated by 100 GHz and associated with a corresponding wavelength pass-band 204, 204a-c of about 40 GHz. However, in other configurations, the wavelength pass-band 204 may be greater than or equal to 40 GHz. The wavelength pass-band 204a associated with wavelength $\lambda_a$ is defined by lower and upper wavelength limits $\lambda_1$, $\lambda_2$, the wavelength pass-band 204b associated with wavelength $\lambda_b$ is defined by upper and lower wavelength limits $\lambda_3$, $\lambda_4$, and the wavelength pass-band 204c associated with wavelength $\lambda_c$ is defined by upper and tower wavelength limits $\lambda_5$, $\lambda_6$. The wavelength pass-bands 204 may be separated by a range of wavelengths associated with a stop-band. In the example shown, a stop-band is defined between the upper wavelength limit $\lambda_2$ of the wavelength pass-band 204a and the lower wavelength limit $\lambda_3$ of the wavelength pass-band 204b, and another stop-band is defined between the upper wavelength limit $\lambda_4$ of the wavelength pass-band 204b and the lower wavelength limit $\lambda_5$ of the wavelength pass-band 204c.

In some implementations, each demultiplex port 220, 220a-n of the AWG 180 is associated with a corresponding one of the wavelength pass-bands 204, 204a-n. Here, the AWG 180 is configured to allow passage of each upstream optical signal 104u having a wavelength within the wavelength pass-band 204 associated with the corresponding demultiplex port 220. However, for any upstream optical signals 104u having a wavelength outside the wavelength pass-band 204 associated with the corresponding demultiplex port 220, the AWG 180 is configured to block the passage of those upstream optical signals 104u. In the example shown, the ONU transceiver 142a of the ONU 140a transmits a corresponding optical signal 104ua at a wavelength within the wavelength pass-band 204a of the corresponding demultiplex port 220a. For instance, the wavelength of the optical signal 104ua is greater than the lower wavelength limit $\lambda_1$ and less than the upper wavelength limit $\lambda_2$ of the wavelength pass-band 204a. Similarly, each ONU transceiver 142b-n of the ONUs 140b-n transmits a corresponding optical signal 104ub-104un at a corresponding wavelength within the wavelength pass-band 204b-n associated with the corresponding demultiplex port 220b-n.

Generally, to avoid crosstalk at the OLT 120, only one ONU 140 transmits upstream optical signals 104u to the OLT 120 at a time. The ONU transceivers 142 include a transmitter 300 (FIGS. 3A-3C), usually a semiconductor laser, configured to transmit upstream optical signals 104u to the OLT 120 in a burst-on state. Turning off the tunable laser 300 to cease transmission of the optical signals 104u to the OUT 120 when not in use causes the temperature of the tunable laser 300 to cool. The tunable laser 300 is once again heated when turned on to transmit a subsequent upstream optical signal 104u. The thermal fluctuation caused by the repeated heating and cooling results in wavelength drift each time the laser is turned on. In some examples, the wavelength of the optical signals 104u drift out of the wavelength pass-band 204 associated with the band-multiplexer 160, 180, thereby resulting in the band-multiplexer 160, 180 blocking the passage there through of the optical signals 104u to the OLT 120.

Referring further to FIG. 2, a wavelength pass-band 204 corresponds to a range where the tunable laser 300 expresses a working wavelength $\lambda_w$. For instance, the working wavelength $\lambda_w$ of the optical signal 104un is greater than the lower wavelength limit $\lambda_n$ and less than the upper wavelength limit $\lambda_{n+1}$ of the wavelength pass-band 204n. When the tunable laser 300 is in a burst-on state, the tunable laser 300 is operating with a working wavelength between the lower wavelength limit $\lambda_n$ and the upper wavelength limit $\lambda_{n+1}$. To avoid thermal fluctuations causing wavelength drift (e.g., completely turning off and on the tunable laser 300), the tunable laser 300 during a burst-off state may shift to a standby wavelength $\lambda_s$ outside the lower wavelength limit $\lambda_n$ and the upper wavelength limit $\lambda_{n+1}$. Here, the DWDM architecture 200 with the band-multiplexer 160 (e.g., the AWG 180) is configured to block the passage of the standby wavelength $\lambda_s$ during the burst-off state, but express the working wavelength $\lambda_w$ during the burst-on state. As shown in FIG. 2, an enlarged curve depicts the wavelength pass-band 204 with the working wavelength $\lambda_w$ being expressed as an arrow passing through the curve during the burst-one state. Similarly, the enlarged curve illustrates the standby wavelength $\lambda_s$ outside the wavelength pass-band 204 as an arrow failing to pass through the curve during the burst-off state. In other words, the AWG 180 and/or DMUX 160 may be configured to optically filter a power of the tunable laser 300 at the standby wavelength $\lambda_s$ without affecting other working channels of the optical communication system 100. By optically filtering the power of the tunable laser 300 at the standby wavelength $\lambda_s$, the tunable laser 300 may suppress the wavelength drift associated with fast burst times.

Figure 3A:
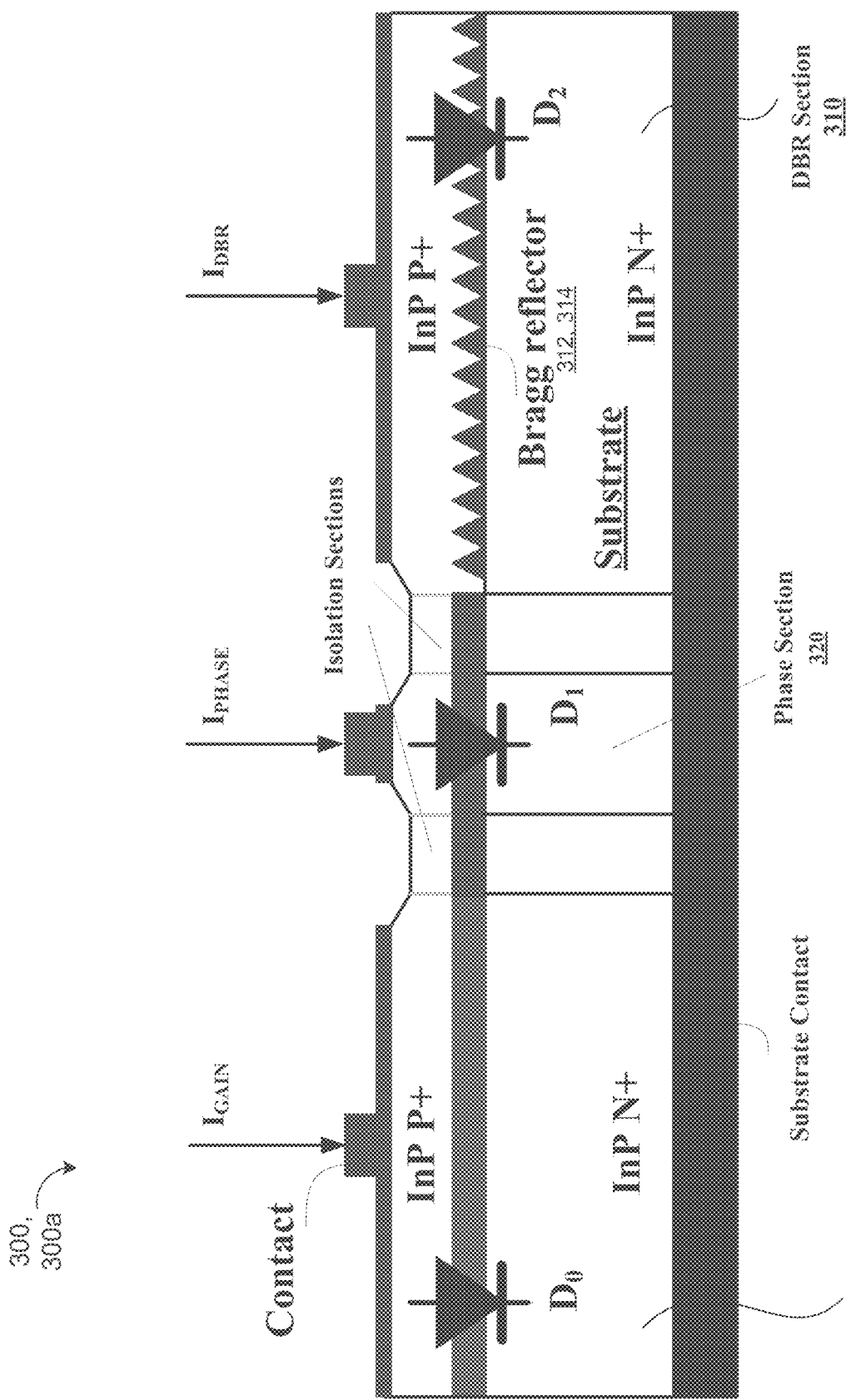
FIG. 3A is a schematic view of an example of a tunable Directly Modulated Laser (DML) as a multi-section tunable laser.
Figure 3B:
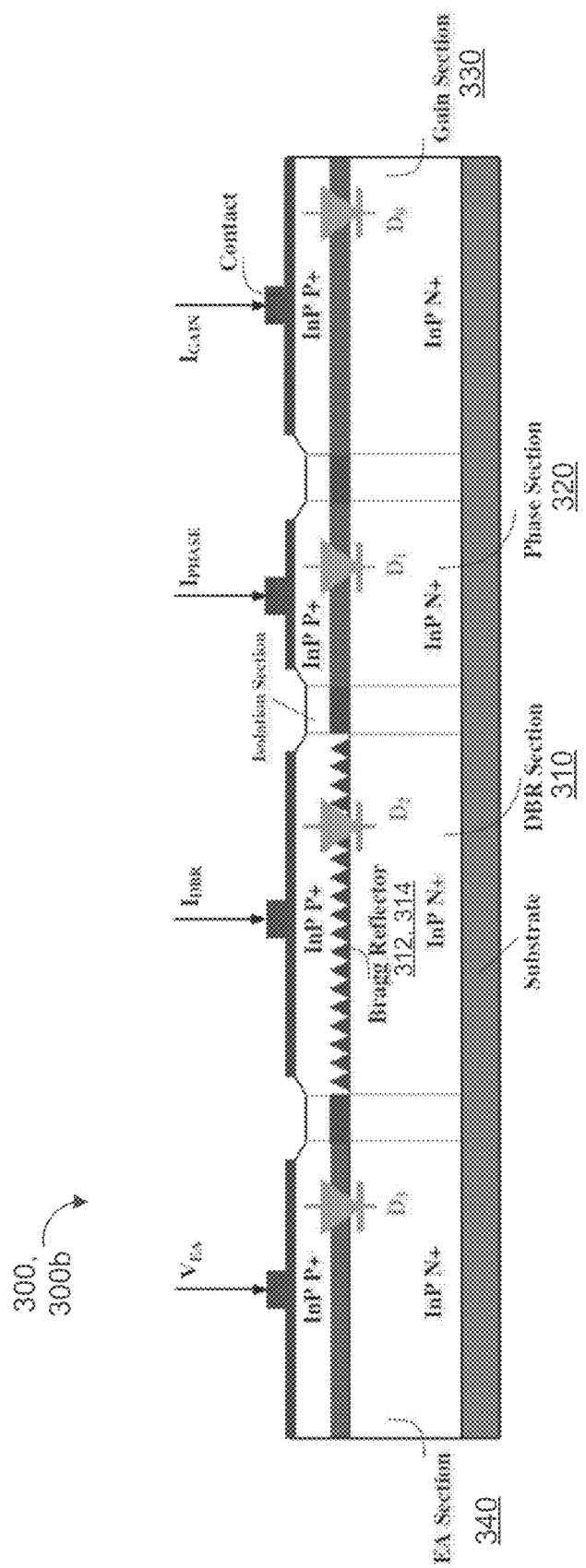
FIG. 3B is a schematic view of an example of a tunable Electro-Absorption Modulated Laser (EML) as a multi-section tunable laser.
Figure 3C:
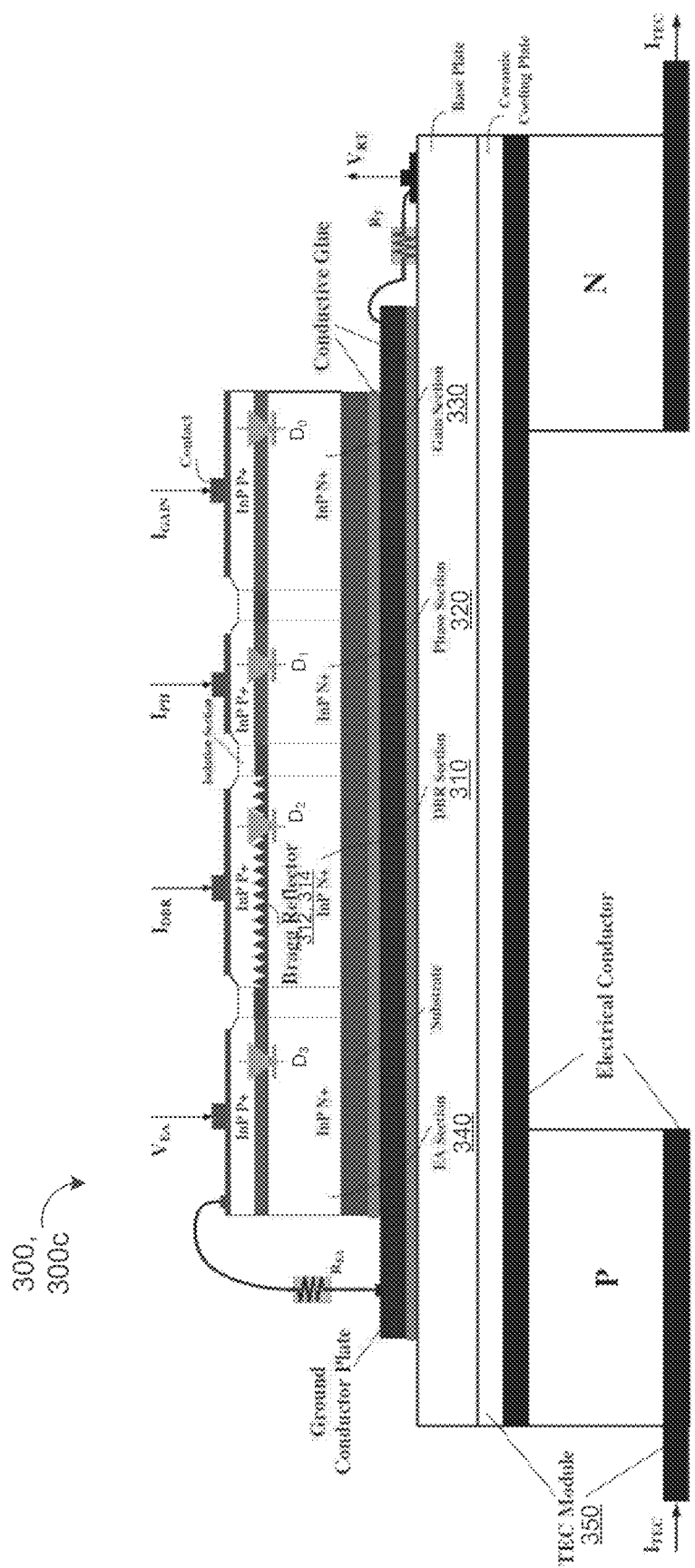
FIG. 3C is a schematic view of an example of a multi-section tunable laser with thermoelectric cooling (TEC) control.

FIGS. 3A-3C are examples of tunable lasers 300, 300a-c. In these examples, the tunable laser 300 includes a multi-section structure with all sections/structures sharing a common substrate. In some implementations, such as FIGS. 3A-3C, the tunable laser 300 includes a Distributed Bragg Reflector (DBR) section 310, a phase section 320, and a gain section 330 on a same substrate. The DBR section 310 is configured to perform as a wavelength tuning mechanism for the tunable laser 300. The phase section 320 may provide adjustable phase shifts for fine-turning the wavelength through a phase injection current ($I_{PHASE}$). The gain section 330 may provide two functions: (1) generating a suitable optical power for achieving the transmission distance of the optical signal 104u to the OLT 120; and (2) generating information carried by the wavelength. The tunable laser 300 and/or circuitry communicating with the tunable laser 300 may provide these gain section functions through implementation of the driving current and the modulation current, denoted as $I_{GAIN}$ in the example shown. The driving current generates output power and the modulation current adds the information to the carrier wavelength. In some examples, such as FIG. 3A, the tunable laser 300, 300a is a Directly Modulated Laser (DML). Additionally or alternatively, temperature control (e.g., via a Thermoelectric Cooling (TEC) module 350 as shown in FIG. 3C) may be also used to fine-tune the wavelength.

In other implementations, the tunable laser 300 additionally includes an electro-absorption section 340 (e.g., FIGS. 3B and 3C) and/or the TEC module 350 (e.g., FIG. 3C). For example, the tunable laser 300b of FIG. 3B and the tunable laser 300c of FIG. 3C correspond to a tunable Electro-absorption Modulated Laser (EML). In some examples, the optical communication system 100 incorporates an EML as the tunable laser 300 to achieve longer communication distances at higher speeds than a DML. As seen by comparing FIG. 3A and FIG. 3B, a tunable EML is similar in structure to a tunable DML except that the tunable EML receives an input voltage $V_{EA}$ applied to the electro-absorption section 340 to generate optical outputs. Additionally or alternatively, when the tunable laser 300 includes the TEC module 350, as shown in FIG. 3C, the TEC module 350 may include a ceramic cooling plate and a P-doped and N-doped region between conductors associated with an injection current $I_{TEC}$.

In the examples shown, each section of the tunable laser 300 has P doping regions (InP P+) with N doping regions (InP N+) on a shared-substrate to form corresponding diodes (e.g., $D_0$, $D_1$, $D_2$, $D_3$). Here, the tunable laser 300 has a structure on the shared-substrate that forms a common cathode which normally is grounded during applications. The diodes ($D_0$, $D_1$, $D_2$) for the tunable laser 300 all share the same cathode for circuit behaviors. These diodes may be driven by corresponding injection currents (e.g., $I_{GAIN}$, $I_{PHASE}$, $I_{DBR}$). While low-speed programmable digital to analog conveners (DACs) can provide $I_{DBR}$ and $I_{PHASE}$, circuitry (e.g., a laser driving circuit) of the tunable laser 300 can provide $I_{GAIN}$ through a common-cathode topology with the capability to provide both the driving current and the high-speed modulation current. The WDM-PON requires the tunable laser 300 to have stable wavelength and fast ON_OFF times during burst operations. Therefore, by reducing the wavelength drift and speeding up burst operations with improved laser circuit designs, tunable lasers 300 provide reduced costs over optical technology improvements.

Referring further to FIGS. 3A-3C, each tunable laser 300, 300a-c incorporates the DBR section 310 as a wavelength tuning mechanism. Generally, the tuning mechanism is configured to change a refractive index 312 of a DBR 314 within the DBR section 310. In some implementations, the refractive index 312 of the DBR 314 changes by introducing a tuning current (i.e. a DBR current $I_{DBR}$) to the DBR section 310. The DBR current $I_{DBR}$ may, therefore, tune the wavelength $\lambda$ of the tunable laser 300. For instance, as the DBR current $I_{DBR}$ changes, a carrier density associated with a cavity of the tunable laser 300 varies. This carrier density variation results in a change to the refractive index 312 and accordingly, the wavelength $\lambda$.

In some configurations, lasers seek to perform fast reliable communications through burst operations. Yet with any electrical signal transferred through circuitry, the electrical parameters impart thermal signatures to materials used to construct the circuitry. With burst operations, lasers may become subject to wavelength drift as residual thermal conditions fail to dissipate between bursts. For example, a second laser burst introduces heat that will accumulate with any heat that has not been removed from the circuit following the first laser burst. In other words, wavelength drift may occur when temperatures of the laser caused by residual thermal conditions generate thermal variations (i.e. temperature variations) that may affect a lasers ability to precisely control wavelength. To combat wavelength drift, tunable lasers 300 may incorporate cooling systems, such as TEC modules 350. Yet depending on the burst speed, even cooling systems fail to dissipate all potential thermal variations within the material of the tunable laser 300 before the subsequent burst operations. This thermal variation may become further exacerbated over longer communication distances and faster communication speeds when a laser demands greater power (e.g., greater injection current). As fast burst times reduce overhead and increase bandwidth of an optical communication system, last burst systems demand a suppression of wavelength drift.

As a potential solution, a switching circuit 400 utilizes a tuning mechanism, such as a DBR section 310, to shift the wavelength of a tunable laser 300 from a working wavelength $\lambda_w$ in the burst-on state to an adjacent channel $CH_{adj}$ (i.e. a standby wavelength $\lambda_w$) during the burst-off state of the tunable laser 300 (as shown by FIG. 2). By shifting the working wavelength $\lambda_w$ to the standby wavelength $\lambda_s$ associated with the adjacent channel $CH_{adj}$, an incremental amount of current may drive the tunable laser 300 back to the working wavelength $\lambda_w$ without introducing a significant thermal flux into the tunable laser 300. By contrast, large injection currents are required to drive lasers from an un-powered state, at which no current is applied, to a burst-on state for transmitting at the working wavelength $\lambda_w$. Here, the large injection current required to drive the laser 300 from the burst-off state and into the burst-on state introduces significant thermal flux that produces ripe conditions for wavelength drift. As will become apparent with reference to the switching circuit 400 of FIG. 4, shifting from the working wavelength $\lambda_w$ to the adjacent channel $CH_{adj}$ instead of un-powering the laser 300 requires only the incremental current to drive the tunable laser 300 back to the working wavelength $\lambda_w$, thereby reducing thermal flux and suppressing wavelength drift from the working wavelength $\lambda_w$.

Figure 4:
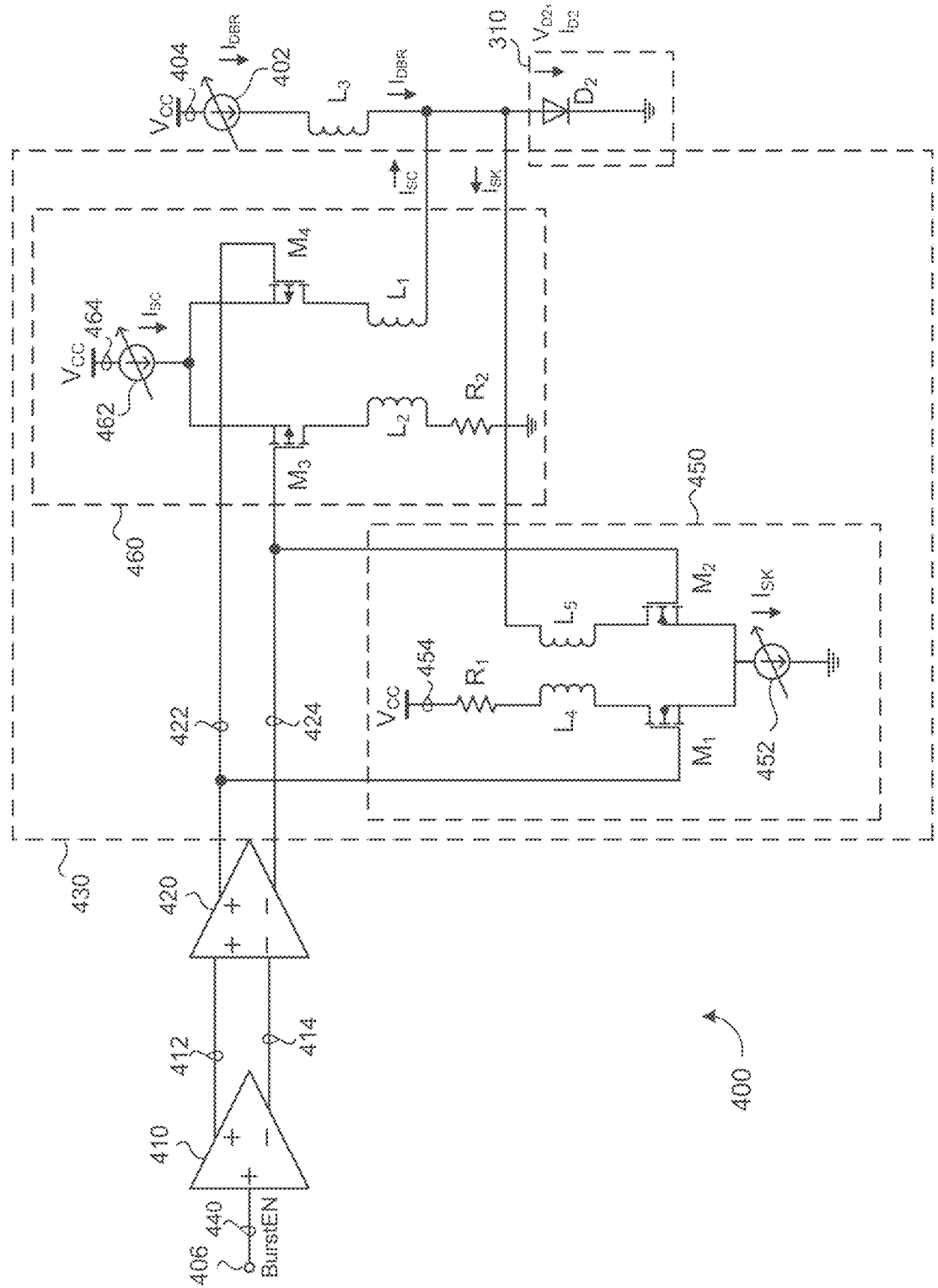
FIG. 4 is a schematic view of an example of a switching circuit for use in a tunable optical network unit (ONU).

FIG. 4 provides a schematic view of an example switching circuit 400 for the tunable laser 300 of the ONU 140. The switching circuit 400 is configured to deliver a bias current to an anode of the DBR section diode $D_2$ disposed on the shared substrate within the DBR section 310. Here, the bias current is the DBR current $I_{DBR}$. A cathode of the DBR-section diode $D_2$ is grounded while the anode of the DBR section diode $D_2$ connects to a current controller 430 and a current source $I_{DBR}$. As shown in FIG. 4, a programmable bias current controller 402 delivers the bias current $I_{DBR}$ to the anode of the DBR section diode $D_2$ based on the voltage source $V_{CC}$. The switching circuit 400 is further configured to modify a current $I_{D2}$ of the DBR section diode $D_2$ depending on whether the tunable laser 300 is in the burst-off state or the burst-on state. By altering the current $I_{D2}$ to the DBR section diode $D_2$, the switching circuit 400 may change/shift the transmit wavelength $\lambda_{Tx}$ of the tunable laser 300 from a working wavelength $\lambda_w$ (i.e. a desired transmission wavelength in the burst-on state) to a standby wavelength $\lambda_s$.

The switching circuit 400 includes a differential converter 410, an amplifier 420, and a current controller 430. The differential converter 410 receives a burst mode signal 440 (shown as BurstEN) from a burst mode signal source 406 as an input signal and converts the burst mode signal 440 into a differential output signal 412, 414. In the example shown, the differential converter 410 is a single-ended to differential converter (i.e. S2D Converter) that receives a single-ended burst input signal 440 and converts the burst mode signal 440 into a first differential output signal 412 and a second differential output signal 414. For example, the burst mode signal 440 is high (e.g., at a logic level 1) indicative of the burst-on state or low (e.g., at a logic level 0) indicative of the burst-off state.

The amplifier 420 of the switching circuit 400 is configured to amplify the differential output signals 412, 414 of the differential converter 410. The resulting amplified differential signals 422, 424 may be a differential output with rail-to-rail swing. For example, the amplifier 420 is a limiting amplifier (LA) that receives the differential output signals 412, 414 as inputs and amplifies these inputs into amplified differential signals 422, 424. As shown by FIG. 4, the amplifier 420 is a differential-in differential-out limiting amplifier for amplifying the differential input data signals 412, 414 from the differential converter 410 at either the burst-on state or the burst-off state. When the amplifier 420 amplifies the differential signals 412, 414, the amplifier 420 is configured to communicate the amplified differential signals 422, 424 to the current controller 430. Additionally or alternatively, the inputs to the amplifier 420 may have termination resistors to avoid signal reflection during amplification.

The switching circuit 400 is configured to deliver the bias current $I_{DBR}$ to the anode of the DBR section diode $D_2$ regardless of whether the burst mode signal 440 is indicative of the burst-on state or the burst-off state. During the burst-on state, the current $I_{D2}$ at the DBR section diode $D_2$ is equal to the bias current $I_{DBR}$ and corresponds to the working wavelength $\lambda_w$. However, during the burst-off state, the current controller 430 is configured to couple an offset current to the anode of the DBR section diode $D_2$. The offset current offsets the bias current $I_{DBR}$ such that the current $I_{D2}$ across the DBR section diode $D_2$ shifts the tunable laser 310 to the standby wavelength $\lambda_s$. Here, the offset current may source a push current to the anode of the $I_{DBR}$ section 310 or the offset current may sink a pull current away from the bias current $I_{DBR}$ at the anode of the DBR section diode $D_2$. In other words, during the burst-on state, the switching circuit 400 ceases to offset the bias current $I_{DBR}$ at the anode of the DBR section diode $D_2$ by either of the push current or the pull current.

To offset the bias current $I_{DBR}$ in the burst-off state, the current controller 430 is configured with a current-mode differential push-pull topology. More specifically, the current controller 430 includes a current pull stage 450 and a current push stage 460. The current pull stage 450 is configured to offset the bias current $I_{DBR}$ with a sink current $I_{SK}$; while the current push stage 460 is configured to offset the bias current $I_{DBR}$ with a source current $I_{SC}$. The combination of the current pull stage 450 and the current push stage 460 results in a current $I_{D2}$ at the anode the DBR section diode $D_2$ equal to a sum of the bias current $I_{DBR}$ and a difference between the source current $I_{SC}$, which sources current to the anode of the DBR section diode $D_2$, and the sink current $I_{SK}$, which sinks current away from the bias current $I_{DBR}$ at the anode of the DBR section diode, as represented by the following equation:

$$I_{D2}=I_{DBR}+(I_{SC}-I_{SK}) \qquad (1)$$

In some implementations, the current pull stage 450 includes a pair of differential transistors $M_1$, $M_2$, a pair of inductors $L_4$, $L_5$, the current sink 452, and a resistor $R_1$. The current sink 452 may include a programmable current sink controller configured to set a magnitude of the sink current $I_{SK}$. In some implementations, the programmable sink controller sets the magnitude of the sink current $I_{SK}$ based on whether the laser 300 is in the burst-on state or the burst-off state. The pair of differential transistors $M_1$, $M_2$ are configured such that at low voltage inputs a gate of the transistor permits current to flow through the transistor. When a transistor, such as transistors $M_1$, $M_2$, receives an input at the gate of the transistor that permits current to flow through the transistor, the transistor is generally referred to as ON or active. In some examples, the transistors $M_1$, $M_2$ are n-type metal-oxide-semiconductors (NMOS) field-effect transistors (MOSFETs). In other examples, the transistors $M_1$, $M_2$ may be bipolar junction transistors (BJTs).

In some examples, the current push stage 460 includes a pair of differential transistors $M_3$, $M_4$, a pair of inductors $L_1$, $L_2$, the current source 462, and a resistor $R_2$. The current source 462 may include a programmable current source controller configured to set a magnitude of the source current $I_{SC}$ based on whether the laser 300 is in the burst-on state or the burst-off state. For instance, the burst-off state may cause the programmable controllers associated with the current sink 452 of the current pull stage 450 and the current source 462 of the current push stage to set respective magnitudes of the sink current $I_{SK}$ and the source current $I_{SC}$ to set the standby wavelength $\lambda_s$. The current source 462 may receive voltage from a voltage source $V_{CC}$ 464. The pair of differential transistors $M_3$, $M_4$ are configured such that at high voltage inputs a gate of each transistor permits current to flow through the transistor. For example, the transistors $M_3$, $M_4$ may be p-type metal-oxide-semiconductors (PMOS) field-effect transistors (MOSFETs). In other examples, the transistors $M_3$, $M_4$ may be bipolar junction transistors (BJTs).

When the burst input signal 440 is indicative of the burst-on state (e.g., BurstEN is high), the amplifier 420 generates a high signal to match the polarity of the burst input signal 440 as the amplified differential signal 422 and a low signal, of a polarity opposite the burst input signal 440, as the amplified differential signal 424. For example, the amplifier 420 amplifies the amplified differential signal 422 to be at the voltage source $V_{CC}$ magnitude and the amplified differential signal 424 to be at a ground magnitude. With a high signal 422 at the current pull stage 450, the gate of the first transistor $M_1$ has sufficient voltage to activate (i.e. turns the first transistor $M_1$ ON). The current pull stage 450 also receives the low signal 424 from the amplifier 420. Here, the low signal 424 at the current pull stage 450 has an opposite effect on the second transistor $M_2$ such that the second transistor $M_2$ receives insufficient voltage and does not activate. With the first transistor $M_1$ active (ON) and second transistor $M_2$ inactive (OFF), the sink current $I_{SK}$ sinks current across the first transistor $M_1$ from the voltage supply $V_{CC}$ 454. For example, as shown in FIG. 4, the sink current $I_{SK}$ sinks current across the first transistor $M_1$ from the voltage supply $V_{CC}$ 454 to ground. With the high signal 422 and the low signal 424 at the current push stage 460, the third transistor $M_3$ activates while the fourth transistor $M_4$ does not activate. Here, with the third transistor $M_3$ active, the source current $I_{SC}$ flows across the third transistor $M_3$ to ground. In other words, when the burst input signal 440 is indicative of the burst-on state, the switching circuit 400 isolates the DBR section diode $D_2$ from the current pull stage 450 and the current push stage 460 so that the DBR current $I_{DBR}$ determines the working wavelength $\lambda_s$ of the tunable laser 300. Thus, the current $I_{D2}$ applied to the anode of the DBR section diode $D_2$ is equal to the DBR current $I_{DBR}$.

When the burst input signal 440 is indicative of the burst-off state (e.g., BurstEN is low), the amplifier 420 generates a low signal to match the polarity of the burst input signal 440 as the amplified differential signal 422 and a high signal, of a polarity opposite the burst input signal 440, as the amplified differential signal 424. For example, the amplifier 420 amplifies the amplified differential signal 422 to be at a ground magnitude and the amplified differential signal 424 to be at the voltage source $V_{CC}$ magnitude. With a low signal as the amplified differential signal 422 and a high signal as the amplified differential signal 424, at the current pull stage 450, the first transistor $M_1$ is inactive (OFF) and the second transistor $M_2$ is active (ON). With the first transistor $M_1$ inactivate (OFF) and second transistor $M_2$ active (ON), the sink current $I_{SK}$ sinks current away from the anode of the DBR section diode $D_2$. With the low signal 422 and the high signal 424 at the current push stage 460, the third transistor $M_3$ remains inactivate while the fourth transistor $M_4$ activates. Here, with the fourth transistor $M_4$ active, the source current $I_{SC}$ flows across the fourth transistor $M_4$ to the anode of the DBR section diode $D_2$. In some implementations, the DBR current $I_{DBR}$ is offset by the source current $I_{SC}$ and the sink current $I_{SK}$. For example, the DBR section diode offset current is equal to the source current $I_{SC}$ minus the sink current $I_{SK}$. In other words, when the burst input signal 440 is indicative of the burst-off state, the programmable current source controller 462 and the programmable current sink controller 452 may set current magnitudes to dictate the standby wavelength $\lambda_s$.

Although FIG. 4 illustrates the voltage sources $V_{CC}$ 404, 454, 464 for the programmable bias current controller 402, the programmable sink current controller 452, and/or the programmable source current controller 462, the voltage sources $V_{CC}$ 404, 454, 464 for these components 402, 452, or 462 may be the same voltage source $V_{CC}$ or different voltage sources $V_{CC}$ depending on the configurations of the switching circuit 400. Moreover, the inductors $L_0$, $L_1$, $L_2$, $L_3$, $L_4$, and $L_5$ may be any combination of inductors or ferri-beads to shield parasitics from current sources (e.g., shield the anode of the DBR section diode $D_2$). In some examples, resistors $R_1$, $R_2$ are termination resistors to account for signal speed within the switching circuit 400 of the tunable laser 300.

Figure 5:
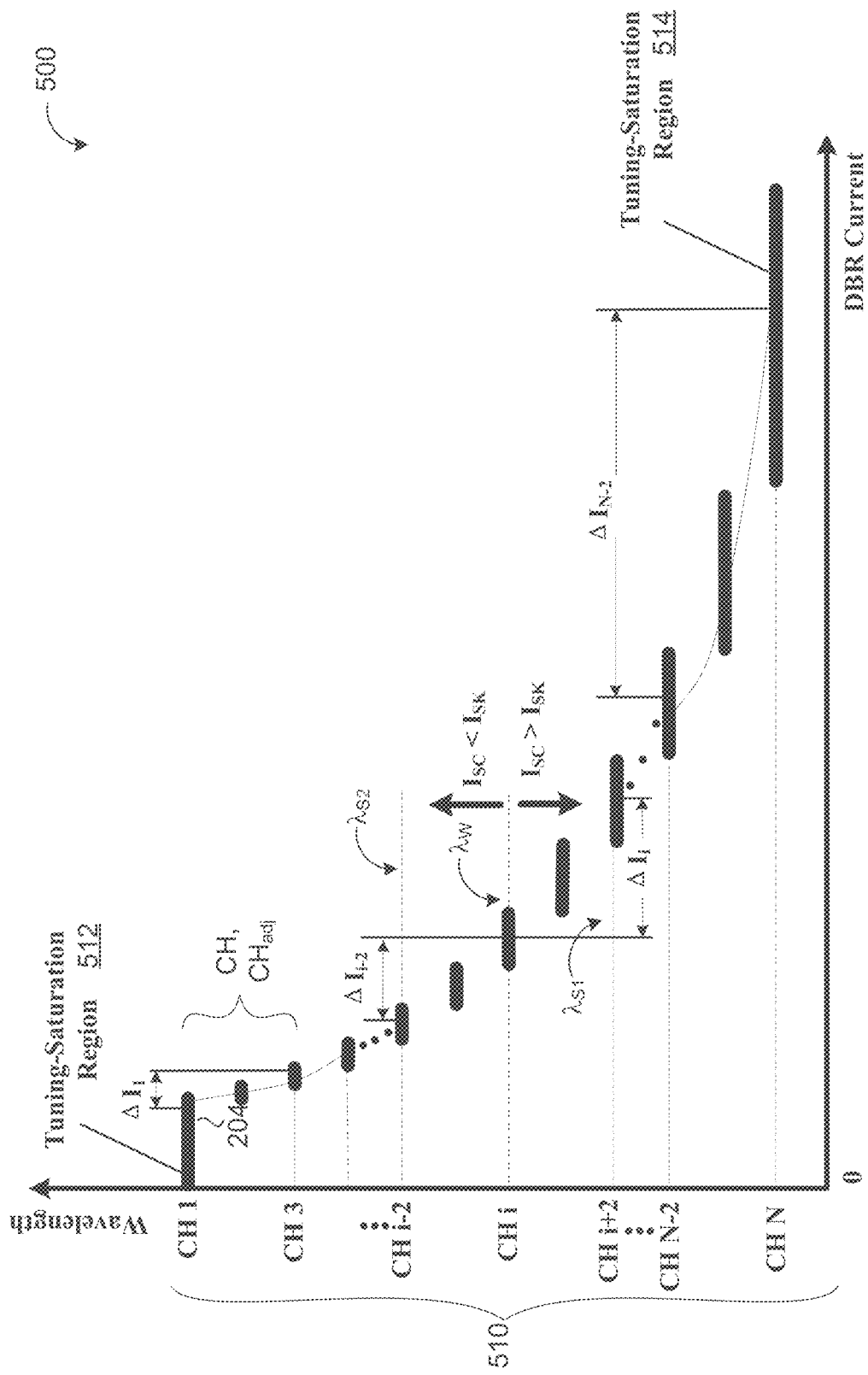
FIG. 5 is a plot for a distributed Bragg reflector (DBR) section diode of the laser switching circuit of FIG. 4 depicting channel wavelength as a function of DBR current.

FIG. 5 is an example plot 500 of the laser transmission wavelength (e.g., the working wavelength $\lambda_s$) as a function of DBR section diode current $I_{D2}$ (labeled on x-axis as "DBR current" and also referred to as the "DBR tuning current"). Here, the y-axis designates a wavelength tuning range 510 of the tunable laser 300. Each end 512, 514 of the wavelength tuning range 510 is a tuning saturation region 512, 514 that corresponds to a channel CH at a beginning or an end of the wavelength tuning range 510. In this example, the tuning saturation region 512, 514 refers to limits of the wavelength tuning range 510 where decreasing the current cannot provide an additional longer-wavelength channel CH or increasing the current cannot provide a shorter wavelength channel CH. Each channel CH, CH 1-N within the wavelength tuning range 510 corresponds to a potential transmission wavelength (e.g., a wavelength pass band 204) of the tunable laser 300 at an associated current range. For example, a width of each wavelength pass band 204 of a respective channel CH corresponds to a current range where the tunable laser expresses a wavelength of the respective channel CH (i.e. a channel wavelength $\lambda$, CH).

Within the wavelength tuning range 510, the DBR section diode current $I_{D2}$ generally follows a logarithmic relationship. As a channel number N and the magnitude of the DBR tuning current increases, the wavelength $\lambda$ decreases in an inverse proportional relationship between the DBR tuning current and the wavelength $\lambda$. Moreover, FIG. 5 further illustrates that as the wavelength $\lambda$ decreases, changing the channel CH demands a larger change in current $\Delta I$. FIG. 5 depicts changes in current $\Delta I$ between adjacent channels (e.g., a first channel CH, CH 1 to a second channel CH, CH 3) For example, changing the channel from a first channel CH, CH 1 to a second channel CH, CH 3 demands a first change in current $\Delta I_1$. Comparatively, changing the channel CH from the second channel CH, CH 3 to a third channel CH, CH 5 demands a second change in current $\Delta I_2$ where the second change in current $\Delta I_2$ is greater than the first change in current $\Delta I_1$. As seen in FIG. 5, in some examples, to prevent noise (e.g., bit error rates) from directly adjacent channels, such as channel one CH, CH 1 and channel two CH, CH 2 (not shown), the tunable laser 300 transitions to an adjacent channel CH, $CH_{adj}$ that is two channels CH, CH N+/−2 away from initial channel CH, CH N. In other words, the tunable laser 300 may switch front the working wavelength $\lambda_w$ of channel i CH, CH i to a standby wavelength $\lambda_s$ of either a greater wavelength (e.g., channel i−2 CH, CH i−2) or a lower wavelength (e.g., channel i+2 CH, CH i+2). With the logarithmic relationship, changing the channel CH to a lower wavelength demands a greater change in current $\Delta I$.

In some implementations, the current-mode differential push-pull topology of the switching circuit 400 enables the switching circuit 400 to control a polarity of the standby wavelength $\lambda_s$ (e.g., the channel CH of the standby wavelength $\lambda_s$) when the burst mode signal 440 is indicative of the burst-off state. The switching circuit 400 controls the polarity by shifting the working wavelength $\lambda_w$ to a standby wavelength $\lambda_s$ of either a lower wavelength or a higher wavelength. For example, as FIG. 5 depicts, the switching circuit 400 either sources the push current with the bias current $I_{DBR}$ to the anode of the DBR section diode or sinks the pull current away from the bias current $I_{DBR}$ at the anode of the DBR section diode $D_2$. The switching circuit 400 sources the push current when the source current $I_{SC}$ is greater than the sink current $I_{SK}$. When the source current $I_{SC}$ is greater than the sink current $I_{SK}$, the switching circuit 400 shifts the working wavelength $\lambda_w$ towards a lower wavelength shown as the first standby wavelength $\lambda_{s1}$ (e.g., from a first channel, shown as channel i CH, CH i, to an adjacent channel, shown as channel i+2 CH, CH i+2). Alternatively, the switching circuit 400 may sink the pull current away from the bias current $I_{DBR}$ at the anode of the DBR section diode $D_2$. The switching circuit 400 sinks the pull current when the source current $I_{SC}$ is less than the sink current $I_{SK}$. When the source current $I_{SC}$ is less than the sink current $I_{SK}$, the switching circuit 400 shifts the working wavelength towards a lower wavelength, shown as the second standby wavelength $\lambda_{s2}$ (e.g., from a first channel shown as channel i CH, CH i, to an adjacent channel, shown as channel i−2 CH, CH i−2). In some configurations, when the working wavelength corresponds to a tuning saturation region 512, 514, the switching circuit 400 is configured to standby at a standby wavelength $\lambda_s$ within the wavelength tuning range 510. Additionally or alternatively, the switching circuit 400 may be configured to prioritize switching the tunable laser 300 to a standby wavelength $\lambda_s$ of a lower channel CH to reduce power consumption since switching to or from lower channels CH demands less current.

Figure 6:
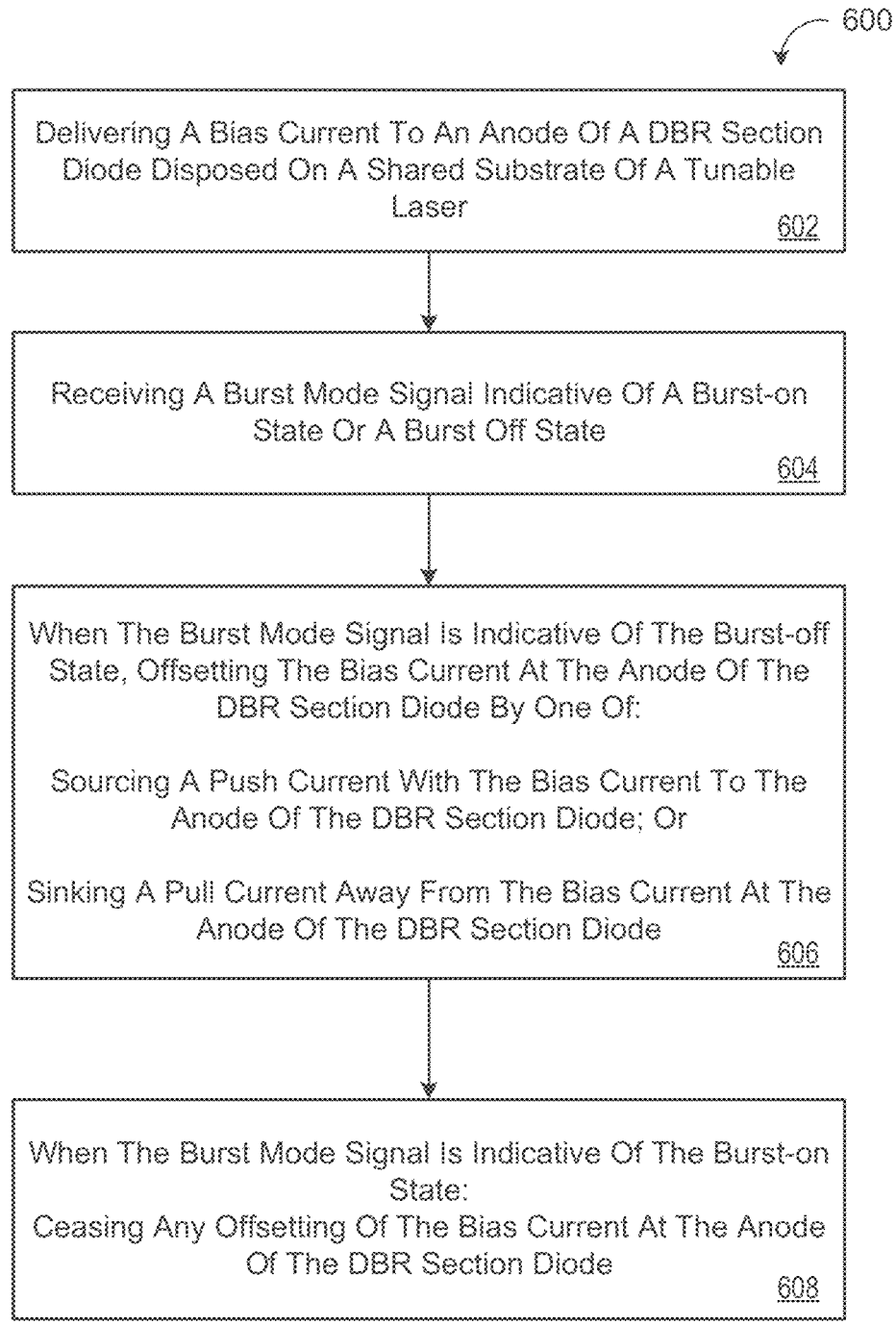
FIG. 6 is a schematic view of an example arrangement of operations for a method of operating a tunable laser.

FIG. 6 depicts a flow diagram of a method 600 for operating a tunable laser 300. At 602, the method 600 includes delivering, by a switching circuit 400, a bias current $I_{DBR}$ to an anode of a distributed Bragg reflector (DBR) section diode $D_2$ disposed on a shared substrate of the tunable laser 300. At 604, the method 600 includes receiving, at the switching circuit 400, a burst mode signal 440 indicative of a burst-on state of a burst-off state. At 606, when the burst mode signal 440 is indicative of the burst-off state, the method 600 offsets, by the switching circuit 400, the bias current $I_{DBR}$ at the anode of the DBR section diode $D_2$ by one of sourcing a push current with the bias current $I_{DBR}$ to the anode of the DBR section diode $D_2$ or sinking a pull current away from the bias current $I_{DBR}$ at the anode of the DBR section diode. At 608, when the burst mode signal 440 is indicative of the burst-on state, the method 600 includes ceasing, by the switching circuit 400, any offsetting of the bias current $I_{DBR}$ at the anode of the DBR section diode $D_2$.

Figure 7:
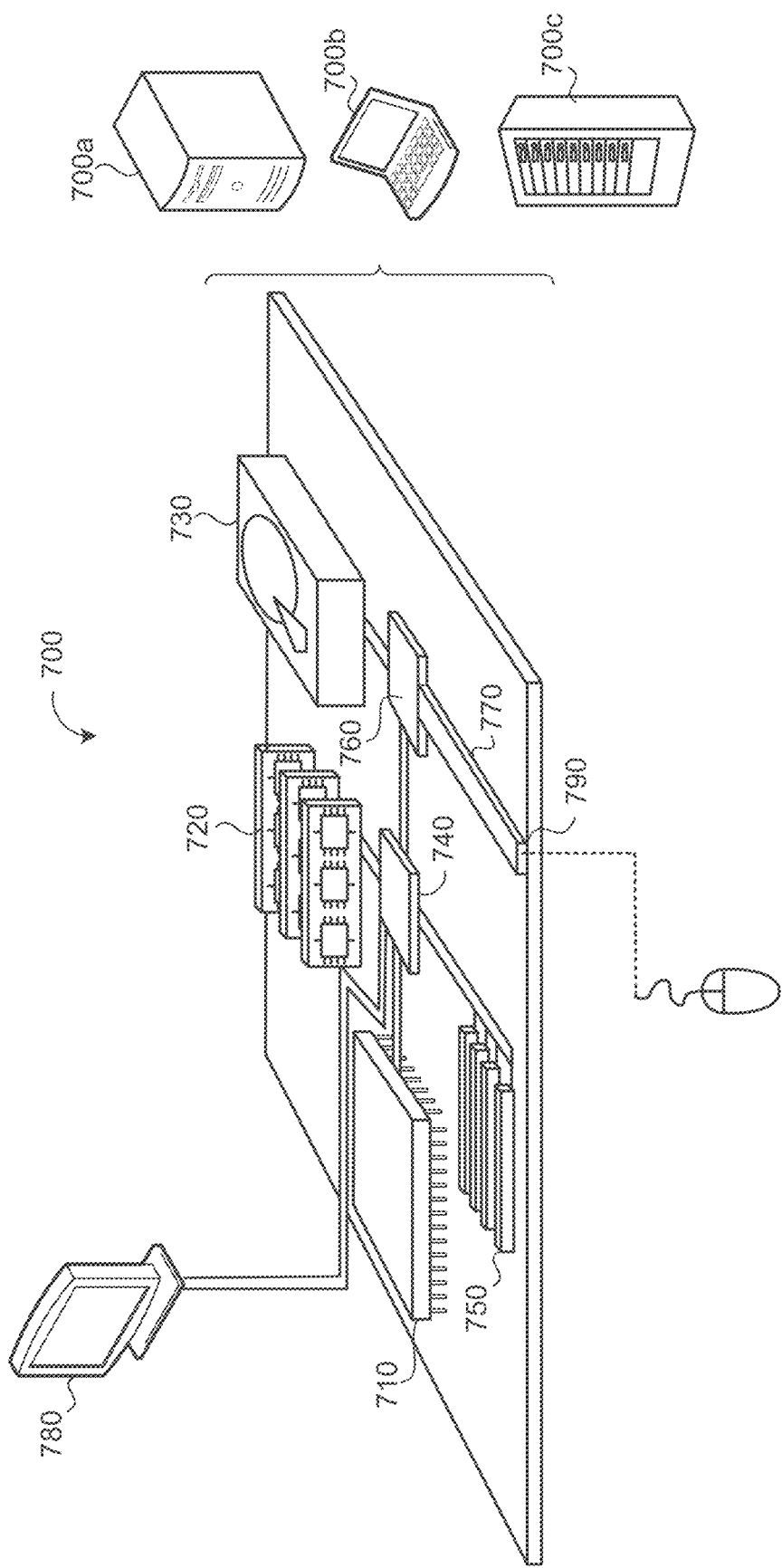
FIG. 7 is a schematic view of an example computing device that may be used to implement the systems and methods described in this document.

FIG. 7 is schematic view of an example computing device 700 that may be used to implement the systems and methods described in this document, for example, to program the magnitudes of $I_{SC}$, $I_{SK}$, $I_{DBR}$, or control the BurstEN signals, etc. The computing device 700 is intended to represent various forms of digital computers, such as laptops, desktops, workstations, personal digital assistants, servers, blade servers, mainframes, and other appropriate computers. The components shown here, their connections and relationships, and their functions, are meant to be exemplary only, and are not meant to limit implementations of the inventions described and/or claimed in this document.

The computing device 700 includes a processor 710, memory 720, a storage device 730, a high-speed interface/controller 740 connecting to the memory 720 and high-speed expansion ports 750, and a low speed interface/controller 760 connecting to a low speed bus 770 and a storage device 730. Each of the components 710, 720, 730, 740, 750, and 760, are interconnected using various busses, and may be mounted on a common motherboard or in other manners as appropriate. The processor 710 can process instructions for execution within the computing device 700, including instructions stored in the memory 720 or on the storage device 730 to display graphical information for a graphical user interface (GUI) on an external input/output device, such as display 780 coupled to high speed interface 740. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 720 stores information non-transitorily within the computing device 700. The memory 720 may be a computer-readable medium, a volatile memory unit(s), or non-volatile memory unit(s). The non-transitory memory 720 may be physical devices used to store programs (e.g., sequences of instructions) or data (e.g., program state information) on a temporary or permanent basis for use by the computing device 700. Examples of non-volatile memory include, but are not limited to, flash memory and read-only memory (ROM)/programmable read-only memory (PROM)/erasable programmable read-only memory (EPROM)/electronically erasable programmable read-only memory (EEPROM) (e.g., typically used for firmware, such as boot programs). Examples of volatile memory include, but are not limited to, random access memory (RAM), dynamic random access memory (DRAM), static random access memory (SRAM), phase change memory (PCM) as well as disks or tapes.

The storage device 730 is capable of providing mass storage for the computing device 700. In some implementations, the storage device 730 is a computer-readable medium. In various different implementations, the storage device 730 may be a floppy disk device, a hard disk device, an optical disk device, or a tape device, a flash memory or other similar solid state memory device, or an array of devices, including devices in a storage area network or other configurations. In additional implementations, a computer program product is tangibly embodied in an information carrier. The computer program product contains instructions that, when executed, perform one or more methods, such as those described above. The information carrier is a computer- or machine-readable medium, such as the memory 720, the storage device 730, or memory on processor 710.

The high speed controller 740 manages bandwidth-intensive operations for the computing device 700, while the low speed controller 760 manages lower bandwidth-intensive operations. Such allocation of duties is exemplary only. In some implementations, the high-speed controller 740 is coupled to the memory 720, the display 780 (e.g., through a graphics processor or accelerator), and to the high-speed expansion ports 750, which may accept various expansion cards (not shown). In some implementations, the low-speed controller 760 is coupled to the storage device 730 and a low-speed expansion port 790. The low-speed expansion port 790, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 700a or multiple times in a group of such servers 700a, as a laptop computer 700b, or as part of a rack server system 700c.

Various implementations of the systems and techniques described herein can be realized in digital electronic and/or optical circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" and "computer-readable medium" refer to any computer program product, non-transitory computer readable medium, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions anchor data to a programmable processor.

The processes and logic flows described in this specification can be performed by one or more programmable processors executing one or more computer programs to perform functions by operating on input data and generating output. The processes and logic flows can also be performed by special purpose logic circuitry, e.g., an FPGA (field programmable gate array) or an ASIC (application specific integrated circuit). Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, one or more aspects of the disclosure can be implemented on a computer having a display device, e.g., a CRT (cathode ray tube), LCD (liquid crystal display) monitor, or touch screen for displaying information to the user and optionally a keyboard and a pointing device, e.g., a mouse or a trackball, by which the user can provide input to the computer. Other kinds of devices can be used to provide interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user, for example, by sending, web pages to a web browser on a user's client device in response to requests received from the web browser.

A number of implementations have been described. Nevertheless, it will be understood that various modifications may be made without departing from the spirit and scope of the disclosure. Accordingly, other implementations are within the scope of the following claims.

What is claimed is:

1. A method for tuning a tunable laser, the method comprising:
   delivering, by a switching circuit, a bias current to an anode of a distributed Bragg reflector (DBR) section diode disposed on a shared substrate of the tunable laser;
   receiving, at the switching circuit, a burst mode signal indicative of a burst-on state or a burst-off state;
   when the burst mode signal is indicative of the burst-off state, offsetting, by the switching circuit, the bias current at the anode of the DBR section diode by one of:
      sourcing a push current with the bias current to the anode of the DBR section diode; or
      sinking a pull current away from the bias current at the anode of the DBR section diode; and
   when the burst mode signal is indicative of the burst-on state, ceasing, by the switching circuit, any offsetting of the bias current at the anode of the DBR section diode,
   wherein, when the burst mode signal is indicative of the burst-off state, the DBR section diode receives a diode current equal to a sum of the bias current and a difference between a source current that sources current to the anode of the DBR section diode and a sink current that sinks current away from the bias current at the anode of the DBR section diode.

2. The method of claim 1, wherein:
   the bias current at the anode of the DBR section diode causes the tunable laser to transmit on a first channel associated with a working wavelength when the burst mode signal is indicative of the burst-on state; and
   the offsetting of the bias current at the anode of the DBR section diode causes the tunable laser to transmit on a second channel adjacent to the first channel when the burst mode signal is indicative of the burst-off state, the second channel associated with a standby wavelength.

3. The method of claim 2, wherein:
   the standby wavelength is greater than the working wavelength when the bias current at the anode of the DBR section diode is offset by sourcing the push current with the bias current; and
   the standby wavelength is less than the working wavelength when the bias current at the anode of the DBR section diode is offset by sinking the pull current away from the bias current.

4. The method of claim 1, wherein, when the burst mode signal is indicative of the burst-off state and the source current is greater than the sink current, the bias current is offset by the sourcing of the push current with a magnitude equal to the difference between the source current and the sink current.

5. The method of claim 1, wherein, when the burst mode signal is indicative of the burst-off state and the source current is less than the sink current, the bias current is offset by the sinking of the pull current from the bias current by a magnitude equal to the difference between the source current and the sink current.

6. The method of claim 1, wherein, when the burst mode signal is indicative of the burst-on state, the DBR section diode receives a diode current equal to the bias current.

7. The method of claim 1, further comprising, when the burst mode signal is indicative of the burst-off state:
receiving, at the switching circuit, a sink current from a current pull stage of the switching circuit that sinks current away from the bias current at the anode of the DBR section diode; and
receiving, at the switching circuit, a source current from a current push stage of the switching circuit that sources current to the anode of the DBR section diode.

8. The method of claim 7, wherein the current pull stage comprises a differential pair of first and second transistors, each transistor connected to a burst mode signal source, the first transistor connected to a first inductor and a resistor, the resistor connected to a voltage source, the second transistor connected to a second inductor, the second inductor connected to the anode of the DBR section diode.

9. The method of claim 8, wherein the first transistor is turned off and the second transistor is turned on to sink the sink current away from the anode of the DBR section diode when the burst mode signal is indicative of the burst-off state.

10. The method of claim 8, wherein the first transistor is turned on and the second transistor is turned off to sink current across the resistor, the first inductor, and the first transistor from the voltage source connected to the resistor when the burst mode signal is indicative of the burst-on state.

11. The method of claim 7, wherein the current push stage comprises a differential pair of first and second transistors, each transistor connected to a burst mode signal source and a voltage source, the first transistor connected to a first inductor and a resistor, the resistor connected to ground, the second transistor connected to a second inductor, the second inductor connected to the anode of the DBR section diode.

12. The method of claim 11, wherein the first transistor is turned off and the second transistor is turned on to source the source current to the anode of the DBR section diode when the burst mode signal is indicative of the burst-off state.

13. The method of claim 11, wherein the first transistor is turned on and the second transistor is turned off to draw the source current across the first transistor and through the first inductor and the resistor to the ground.

14. A switching circuit for tuning a tunable laser, the switching circuit comprising:
a voltage source configured to deliver a bias current to an anode of a DBR section diode disposed on a shared substrate of the tunable laser;
a current controller configured to receive a burst mode signal indicative of a burst-on state or a burst-off state, the current controller configured to:
when the burst mode signal is indicative of the burst-off state, offset the bias current at the anode of the DBR section diode by one of:
sourcing a push current with the bias current to the anode of the DBR section diode; or
sinking a pull current away from the bias current at the anode of the DBR section diode; and
when the burst mode signal is indicative of the burst-on state, cease any offsetting of the bias current at the anode of the DBR section diode,
when the burst mode signal is indicative of the burst-off state, the DBR section diode receives a diode current equal to a sum of the bias current and a difference between a source current that sources current to the anode of the DBR section diode and a sink current that sinks current away from the bias current at the anode of the DBR section diode.

15. The switching circuit of claim 14, wherein:
the bias current at the anode of the DBR section diode causes the tunable laser to transmit on a first channel associated with a working wavelength when the burst mode signal is indicative of the burst-on state; and
the offsetting of the bias current at the anode of the DBR section diode causes the tunable laser to transmit on a second channel adjacent to the first channel when the burst mode signal is indicative of the burst-off state, the second channel associated with a standby wavelength.

16. The switching circuit of claim 15, wherein:
the standby wavelength is greater than the working wavelength when the bias current at the anode of the DBR section diode is offset by sourcing the push current with the bias current; and
the standby wavelength is less than the working wavelength when the bias current at the anode of the DBR section diode is offset by sinking the pull current away from the bias current.

17. The switching circuit of claim 14, wherein, when the burst mode signal is indicative of the burst-off state and the source current is greater than the sink current, the bias current is offset by the sourcing of the push current with a magnitude equal to the difference between the source current and the sink current.

18. The switching circuit of claim 14, wherein, when the burst mode signal is indicative of the burst-off state and the source current is less than the sink current, the bias current is offset by the sinking of the pull current from the bias current by a magnitude equal to the difference between the source current and the sink current.

19. The switching circuit of claim 14, wherein, when the burst mode signal is indicative of the burst-on state, the DBR section diode receives a diode current equal to the bias current.

20. The switching circuit of claim 14, further comprising:
a current pull stage configured to sink a sink current away from the bias current at the anode of the DBR section diode when the burst mode signal is indicative of the burst-off state; and
a current push stage configured to source a source current to the anode of the DBR section diode when the burst mode signal is indicative of the burst-off state.

21. The switching circuit of claim 20, wherein the current pull stage comprises a differential pair of first and second transistors, each transistor connected to a burst mode signal source, the first transistor connected to a first inductor and a resistor, the resistor connected to a voltage source, the second transistor connected to a second inductor, the second inductor connected to the anode of the DBR section diode.

22. The switching circuit of claim 21, wherein the first transistor is turned off and the second transistor is turned on to sink the sink current away from the anode of the DBR section diode when the burst mode signal is indicative of the burst-off state.

23. The switching circuit of claim 21, wherein the first transistor is turned on and the second transistor is turned off to sink current across the resistor, the first inductor, and the first transistor from the voltage source connected to the resistor when the burst mode signal is indicative of the burst-on state.

24. The switching circuit of claim 20, wherein the current push stage comprises a differential pair of first and second transistors, each transistor connected to a burst mode signal source and a voltage source, the first transistor connected to a first inductor and a resistor, the resistor connected to ground, the second transistor connected to a second inductor, the second inductor connected to the anode of the DBR section diode.

25. The switching circuit of claim 24, wherein the first transistor is turned off and the second transistor is turned on to source the source current to the anode of the DBR section diode when the burst mode signal is indicative of the burst-off state.

26. The switching circuit of claim 24, wherein the first transistor is turned on and the second transistor is turned off to draw the source current across the first transistor and through the first inductor and the resistor to the ground.

* * * * *